United States Patent [19]

Tsuneoka et al.

[11] Patent Number: 5,060,050
[45] Date of Patent: Oct. 22, 1991

[54] SEMICONDUCTOR INTEGRATED CIRCUIT DEVICE

[75] Inventors: Masatoshi Tsuneoka, Ohme; Mitsuaki Horiuchi, Hachioji, both of Japan

[73] Assignee: Hitachi, Ltd., Tokyo, Japan

[21] Appl. No.: 577,093

[22] Filed: Aug. 31, 1990

Related U.S. Application Data

[63] Continuation of Ser. No. 219,249, Jul. 15, 1988, abandoned.

[30] Foreign Application Priority Data

Jul. 21, 1987 [JP] Japan .................................. 62-181459

[51] Int. Cl.[5] ..................... H01L 23/48; H01L 29/46; H01L 29/54; H01L 29/62
[52] U.S. Cl. ........................ 357/71; 357/54; 357/65; 357/67
[58] Field of Search ................. 357/71, 65, 54, 67, 357/68

[56] References Cited

U.S. PATENT DOCUMENTS

| | | | |
|---|---|---|---|
| 4,218,271 | 8/1980 | Wood | 148/175 |
| 4,524,378 | 6/1985 | Cockrum et al. | 357/71 |
| 4,566,026 | 1/1986 | Lee et al. | 357/71 |
| 4,656,101 | 4/1987 | Yamazaki | 428/620 |
| 4,680,611 | 7/1987 | Basol | 357/71 |
| 4,714,951 | 12/1987 | Bavdrant et al. | 357/67 |
| 4,816,895 | 3/1989 | Kikkawa | 357/71 |
| 4,912,543 | 3/1990 | Neppl et al. | 357/67 |

FOREIGN PATENT DOCUMENTS

| | | | |
|---|---|---|---|
| 0155737 | 9/1982 | Japan . | |
| 0001846 | 1/1985 | Japan | 357/71 |
| 0174348 | 7/1988 | Japan | 357/71 |
| 0234562 | 9/1988 | Japan | 357/71 |

OTHER PUBLICATIONS

Preliminary Papers of the 47th Science Lecture Meeting of Japan Society of Applied Physics, Paper 30p--N-12, p. 513, 9/86.
Transactions of AIME, vol. 143, 1941, pp. 272-286.
Transactions of AIME, vol. 147, 1942, pp. 48-56.
Transactions of AIME, vol. 152, 1943, pp. 103-121.
Transactions of AIME, vol. 106, 1945, pp. 140-148.

Primary Examiner—Rolf Hille
Assistant Examiner—David Ostrowski
Attorney, Agent, or Firm—Antonelli, Terry, Stout & Kraus

[57] ABSTRACT

In a semiconductor integrated circuit device having copper wiring, the copper wiring is covered with impurity diffusion-preventing films each of which is made of a silicon oxide film formed by plasma CVD, a silicon nitride film, an alumina film, or a titanium nitride film, whereby the resistance of the copper wiring can be prevented from increasing.

17 Claims, 5 Drawing Sheets

SEMICONDUCTOR INTEGRATED CIRCUIT DEVICE

This application is a continuation of application Ser. No. 219, 249, filed on July 15, 1988, abandoned on Sept. 28, 1990.

BACKGROUND OF THE INVENTION

The present invention relates to a semiconductor integrated circuit device, and more particularly to techniques which are effective when applied to a semiconductor integrated circuit device having copper wiring.

With rises in the operating speed and integration density of an LSI (large-scale integrated circuit), a wiring material of low resistivity and high reliability has been requested. In recent years, as the wiring material which meets these requirements, note has been taken of copper having a resistivity of 1.56 $\mu\Omega$-cm (refer to, for example, (1) Official Gazette of Japanese Patent Application Laid-open No. 155737/1982, and (2) Preliminary Papers of the 47th Science Lecture Meeting of the Japan Society of Applied Physics, Paper No. 30p-N-12, p. 513, September 1986).

It has been revealed, however, that copper has the property of increasing its resistivity when impurities such as phosphorus (P) and arsenic (As) are contained therein (refer to, for example, (1) Transactions of AIME, 143(1941), 272, (2) Transactions of AIME, 147(1942), 48, (3) Transactions of AIME, 152(1943), 103, and (4) Transactions of AIME, 106(1946), 144).

SUMMARY OF THE INVENTION

The inventors' study has revealed the problem that, in a case where a silicate glass film usually used in LSIs, such as PSG (phosphosilicate glass) film, BSG (borosilicate glass) film or BPSG (borophosphosilicate glass) film, is employed as the inter-layer insulator film of copper wiring layers, impurities in the inter-layer insulator film diffuse into the copper wiring during the step of annealing carried out in a manufacturing process, resulting in the increase of the resistance of the copper wiring.

A object of the present invention is to provide techniques which can prevent the increase of the resistance of copper wiring.

The above and other objects and novel features of the present invention will become apparent from the description of this specification and the accompanying drawings.

A typical aspect of performance of the present invention is briefly summarized as follows:

Copper wiring is covered with films which prevent the diffusion of impurities.

According to the expedient stated above, the impurities can be prevented by the diffusion preventive films from diffusing into the copper wiring from outside during annealing in a manufacturing process, so that the increase of the resistance of the copper wiring is preventable.

DESCRIPTION OF THE PREFERRED EMBODIMENTS

Now, an embodiment of the present invention will be concretely described with reference to the drawings.

Throughout the drawings for describing the embodiment, identical symbols are assigned to portions having the same functions, and they shall not be repeatedly explained.

Figure 1:
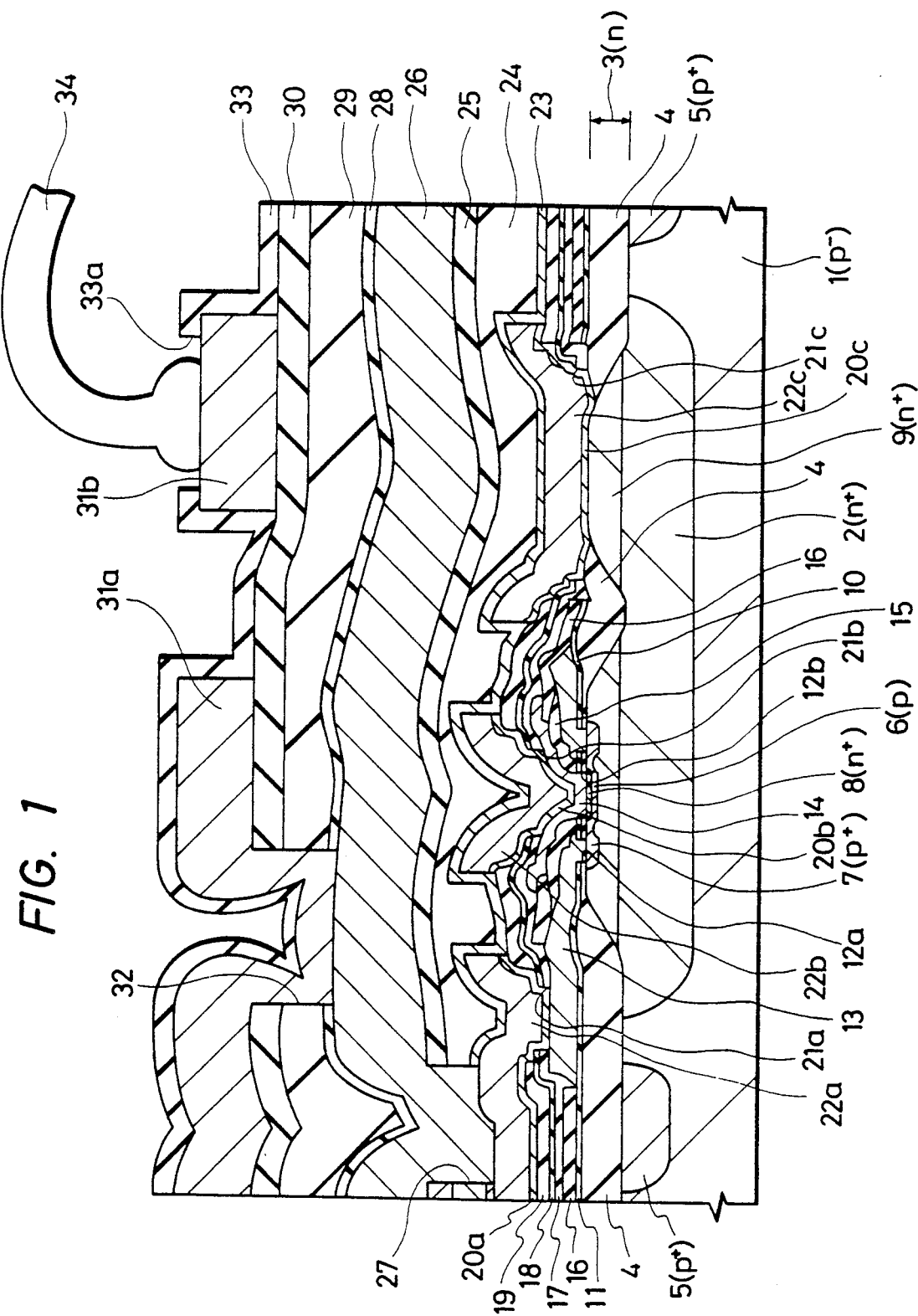
FIG. 1 is a sectional view showing the essential portions of a bipolar LSI which is an embodiment of the present invention.

FIG. 1 is a sectional view which shows the essential portions of a bipolar LSI according to one embodiment of the present invention. Incidentally, this bipolar LSI is a bipolar logic LSI by way of example.

As illustrated in FIG. 1, in the bipolar LSI according to the present embodiment, the front surface of a semiconductor substrate 1 made of, for example, $p^-$-type single-crystal silicon is provided with a buried layer 2 of, for example, the $n^+$-type, and an epitaxial layer 3 of, for example, n-type silicon is provided on the semiconductor substrate 1. A field insulator film 4, for example, $SiO_2$ film is provided at the predetermined part of the epitaxial layer 3, whereby the isolation among elements and the isolation within each element are effected. Channel stopper regions 5 of, for example, the $p^+$-type are provided under the field insulator film 4. Besides, an intrinsic base region 6 of, for example, the p-type and a graft base region 7 of, for example, the $p^+$-type in the form of the drawnout region of the intrinsic base region 6 by way of example are provided within that part of the epitaxial layer 3 which is surrounded with the field insulator film 4. An emitter region 8 of, for example, the $n^+$-type is provided in the instrinsic base region 6. Thus, an npn-type bipolar transistor is constructed of the emitter region 8, the intrinsic base region 6, and a collector region which is formed of the parts of the epitaxial layer 3 and the buried layer 2 underlying the intrinsic base region 6.

Numeral 9 designates a collector lead-out region of, for example, the $n^+$-type which is connected with the buried layer 2. Numeral 10 designates an insulator film, for example, $SiO_2$ film which is provided so as to be continuous to the field insulator film 4. In addition, numeral 11 indicates an insulator film, for example, $Si_3N_4$ film. These insulator films 10 and 11 are respectively provided with openings 12a and 12b in correspondence with the graft base region 7 and the emitter region 8. A base lead-out electrode 13 made of a polycrystalline silicon film is connected to the graft base region 7 through the opening 12a, while a polycrystallinesilicon emitter electrode 14 doped with an n-type impurity, for example, arsenic is provided on the emitter region 8 through the opening 12b. Besides, numerals 15, 16 and 17 indicate insulator films, for example, $SiO_2$ films formed by CVD (chemical vapor deposition), numeral 18 indicates an insulator film, for example, $Si_3N_4$ film, and numeral 19 indicates an insulator film, for example, PSG film.

Each of symbols 20a, 20b and 20c denotes a diffusion preventive film which does not contain impurities such as P and B in itself and can prevent these impurities from diffusing, and which is made of an electrically-conductive film, for example, titanium nitride (TiN) film. The diffusion preventive films 20a, 20b and 20c are respectively connected to the base lead-out electrode 13, the polycrystallinesilicon emitter electrode 14 and the collector lead-out region 9 through openings 21a, 21b and 21c which are provided in the insulator films 17 and 18. These diffusion preventive films 20a, 20b and 20c are respectively overlaid with leads 22a, 22b and 22c of first-layer copper wiring. Owing to the diffusion preventive films 20a, 20b and 20c, impurities in the underlying insulator film 19 can be prevented from diffusing into the copper wiring leads 22a, 22b and 22c during annealing. Moreover, the diffusion preventive films 20a, 20b and 20c can enhance the adhesion of the respective copper wiring leads 22a, 22b and 22c with respect to the underlying insulator film 19.

Furthermore, the diffusion preventive films 20a, 20b and 20c can prevent the respective reactions between the base lead-out electrode 13, the polycrystallinesilicon emitter electrode 14 and the collector lead-out region 9 and the corresponding copper wiring leads 22a, 22b and 22c.

Numeral 23 indicates a diffusion preventive film which does not contain impurities such as P and B in itself and can prevent these impurities from diffusing, and which is made of an insulator film, for example, SiO film formed by plasma CVD. This diffusion preventive film 23 can prevent the increases of wiring resistances attributed to the fact that impurities in an insulator film 24 to be described below diffuse into the copper wiring leads 22a, 22b and 22c during annealing. Incidentally, the thickness of the diffusion preventive film 23 should preferably be set at about 100Å or above by way of example. In addition, numeral 24 indicates the insulator film which is, for example, a BPSG film, while numeral 25 indicates a diffusion preventive film which is made of an insulator film, for example, an SiO film formed by plasma CVD. It is added that a PSG film or a BSG film, for example, can alternatively be employed as the insulator film 24. In the present embodiment, an inter-layer insulator film of the first layer is constructed of the diffusion preventive film 23, the insulator film 24 and the diffusion preventive film 25 as a whole.

Second-layer copper wiring 26 is provided on the diffusion preventive film 25. This copper wiring 26 is connected to the copper wiring 22a through a through-hole 27 which penetrates the diffusion preventive film 23, the insulator film 24 and the diffusion preventive film 25. In addition, numeral 28 designates a diffusion preventive film which is made of an insulator film, for example, SiO film formed by plasma CVD, numeral 29 designates a spin-on-glass (SOG) film for flattening a surface, and numeral 30 designates a diffusion preventive film which is made of an insulator film, for example, SiO film formed by plasma CVD. An inter-layer insulator film of the second layer is constructed of the diffusion preventive film 28, the SOG film 29 and the diffusion preventive film 30 as a whole. Shown at numeral 31 is third-layer copper wiring, the copper wiring leads 31a and 31b of which are connected to the copper wiring 26 through through-holes 32 which penetrate the diffusion preventive film 28, the SOG film 29 and the diffusion preventive film 30. Besides, numeral 33 indicates a diffusion preventive film which is made of an insulator film, for example, SiO film formed by plasma CVD and which serves also as a protective film. This diffusion preventive film 33 is provided with an opening 33a, through which a piece of copper wire 34 is bonded to the copper wiring 31b.

As understood from the foregoing, in the present embodiment, the first-layer copper wiring leads 22a, 22b and 22c are entirely covered with the diffusion preventive films 20a, 20b, 20c and 23. Thus, when annealing is carried out at, for example, about 700° C. for the purpose of causing the insulator film 24, for example, BPSG film to reflow, impurities such as B, P and As can be prevented from diffusing from the insulator film 24, insulator film 19 and polycrystalline-slicon emitter electrode 14 into the copper wiring leads 22a, 22b and 22c. Accordingly, the resistances of these copper wiring leads 22a, 22b and 22c can be effectively prevented from increasing due to the annealing. Likewise, the second-layer copper wiring 26 is covered with the diffusion preventive films 25 and 28 substantially entirely except that it is in touch with the insulator film 24 such as BPSG film within the through-hole 27. Therefore, when annealing is carried out at about 400° C. in order to bake the insulator film 29, for example, SOG film, impurities such as B and P can be prevented from diffusing from the insulator film 24 into the copper wiring 26 of this layer, so that the resistance of the copper wiring 26 can be effectively prevented from increasing. Besides, the third-layer copper wiring leads 31a and 31b are covered with the diffusion preventive films 30 and 33 substantially entirely except that they are in touch with the insulator film 29 such as SOG film within the through-holes 32. Therefore, impurities can be prevented from diffusing from outside into the copper wiring leads 31a and 31b during annealing, so that the resistances of these copper wiring leads 31a and 31b can be effectively prevented from increasing. Since, in this manner, the resistances of the copper wiring leads 22a, 22b, 22c, 26, 31a and 31b can be prevented from increasing, the low resistivity inherent in copper can be effectively utilized, whereby the copper wiring leads 22a, 22b, 22c, 26, 31a and 31b of very low wiring resistances can be formed. It is accordingly possible to heighten the operating speed of the LSI.

By the way, oxygen-free copper or electrolytic copper, for example, can be employed as the material of the copper wiring leads 22a, 22b, 22c, 26, 31a and 31b. In the case of employing the electrolytic copper, the solid-solution oxygen concentration thereof should preferably be set at, for example, 0.03% or below from the viewpoint of preventing grain boundary cracks ascribable to hydrogen embrittlement. As the diffusion preventive films 23, 25, 28, 30 and 33, it is also possible to employ, for example, a silicon nitride (SiN) film or alumina ($Al_2O_3$) film formed by plasma CVD.

Next, there will be described an example of a method of manufacturing the bipolar LSI constructed as thus far stated.

Figure 2:
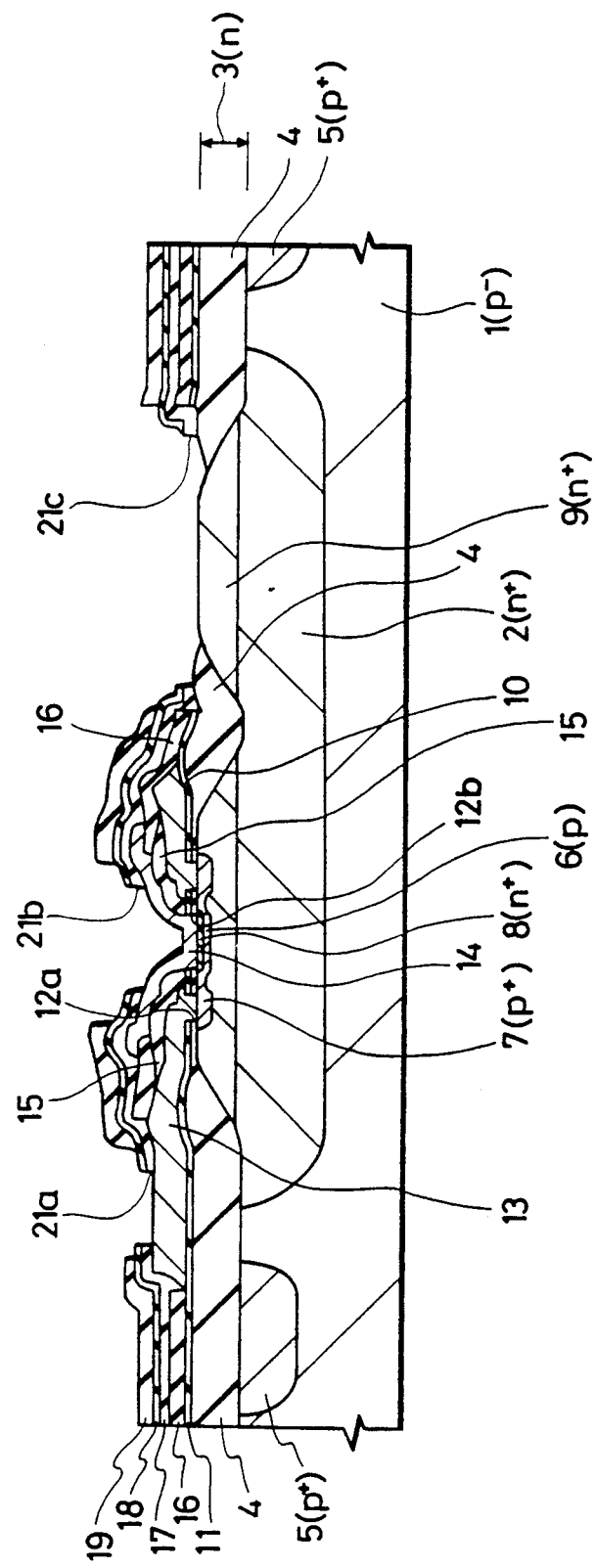
FIGS. 2 thru 5 are sectional views for explaining in the order of steps an example of a method of manufacturing the bipolar LSI shown in FIG. 1.

First, steps are carried forward as in a manufacturing method described in, for example, the official gazette of Japanese Patent Application Publication No. 27469/1980, until an insulator film 19 with openings 21a, 21b and 21c are formed as shown in FIG. 2.

Figure 3:
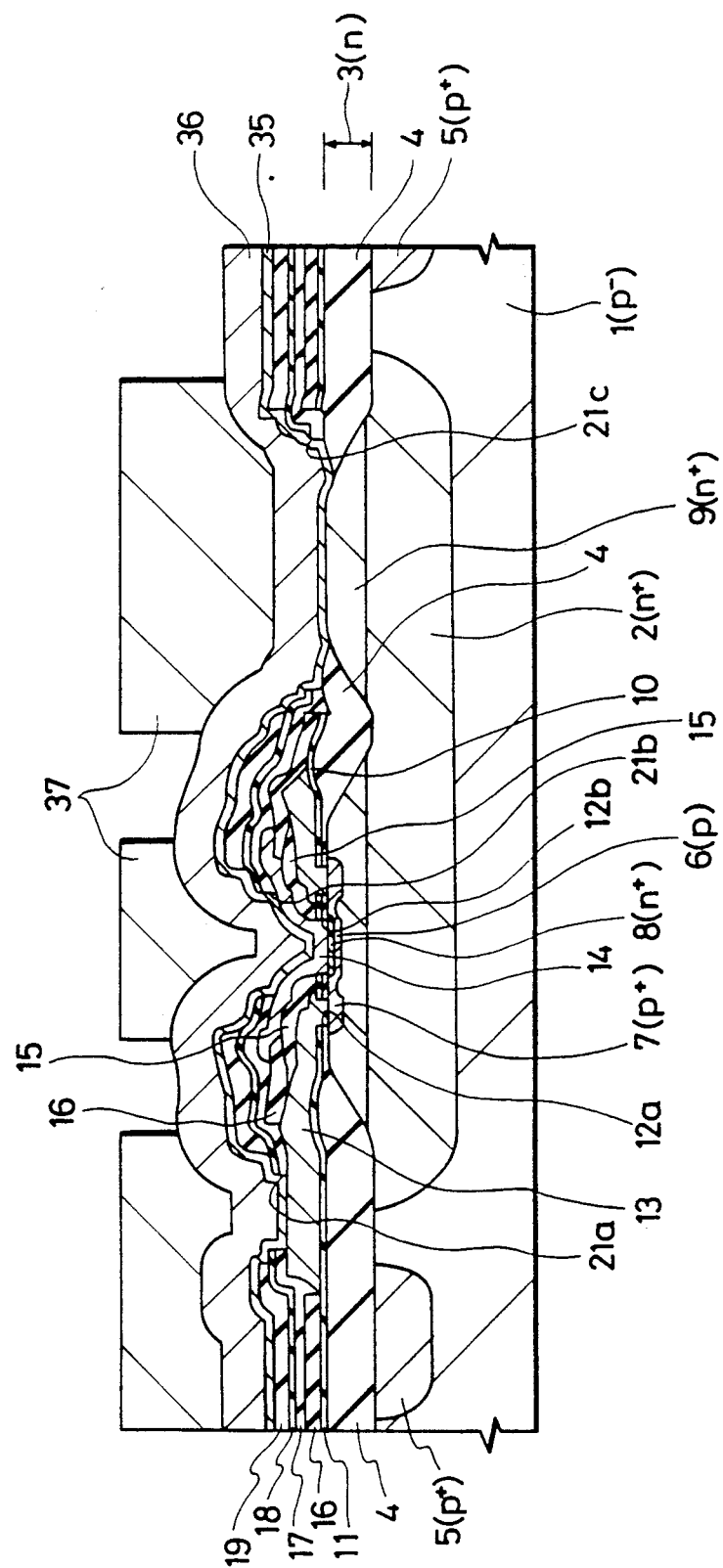

Subsequently, as illustrated in FIG. 3, a TiN film 35 having a thickness of, for example, about 1000–2000Å is formed on the surfaces of a base lead-out electrode 13, a polycrystalline-silicon emitter electrode 14 and a collector lead-out region 9 in the respective openings 21a, 21b and 21c by, for example, reactive sputtering. A copper film 36 is subsequently formed by, for example, reactive sputtering, whereupon a resist pattern 37 in a predetermined shape is formed on the copper film 36.

Figure 4:
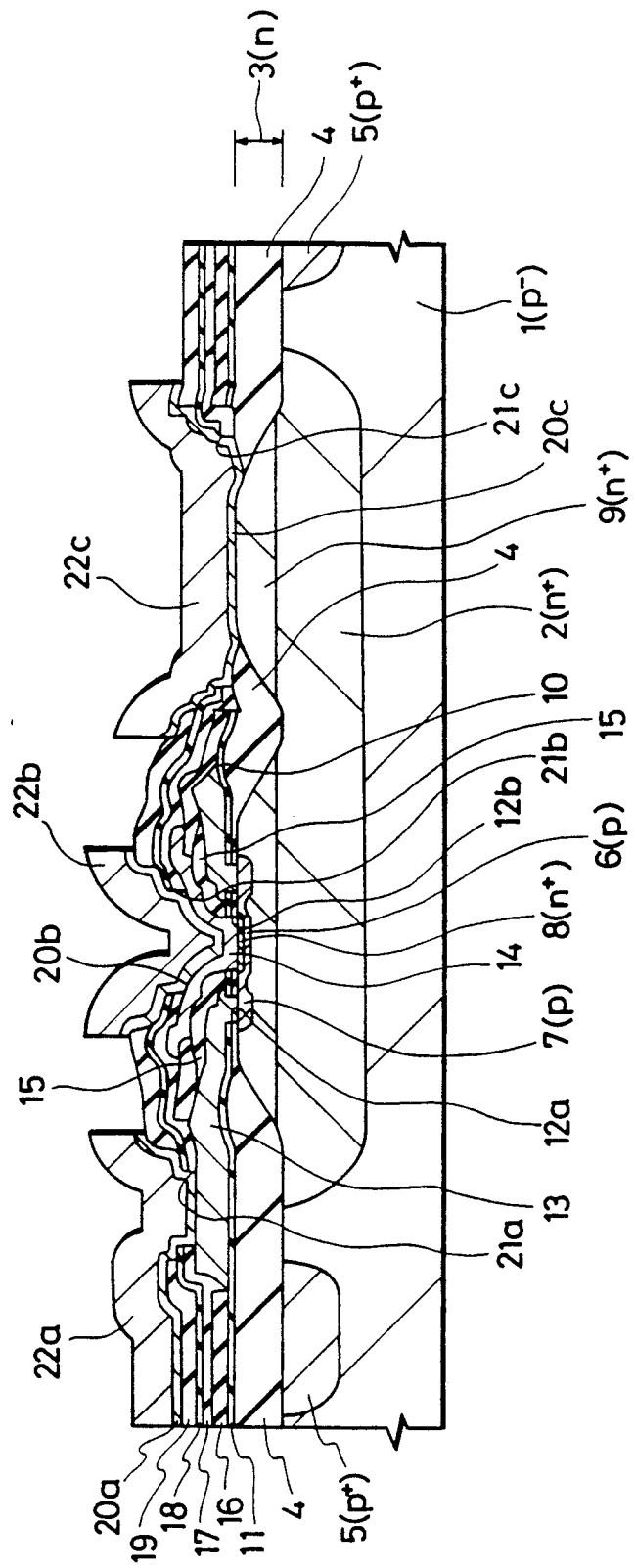

Subsequently, using the resist pattern 37 as a mask, the copper film 36 and the TiN film 35 are subjected to ion milling, thereby to form diffusion preventive films 20a, 20b and 20c and copper wiring leads 22a, 22b and 22c as shown in FIG. 4. Thereafter, the resist pattern 37 is removed.

Figure 5:
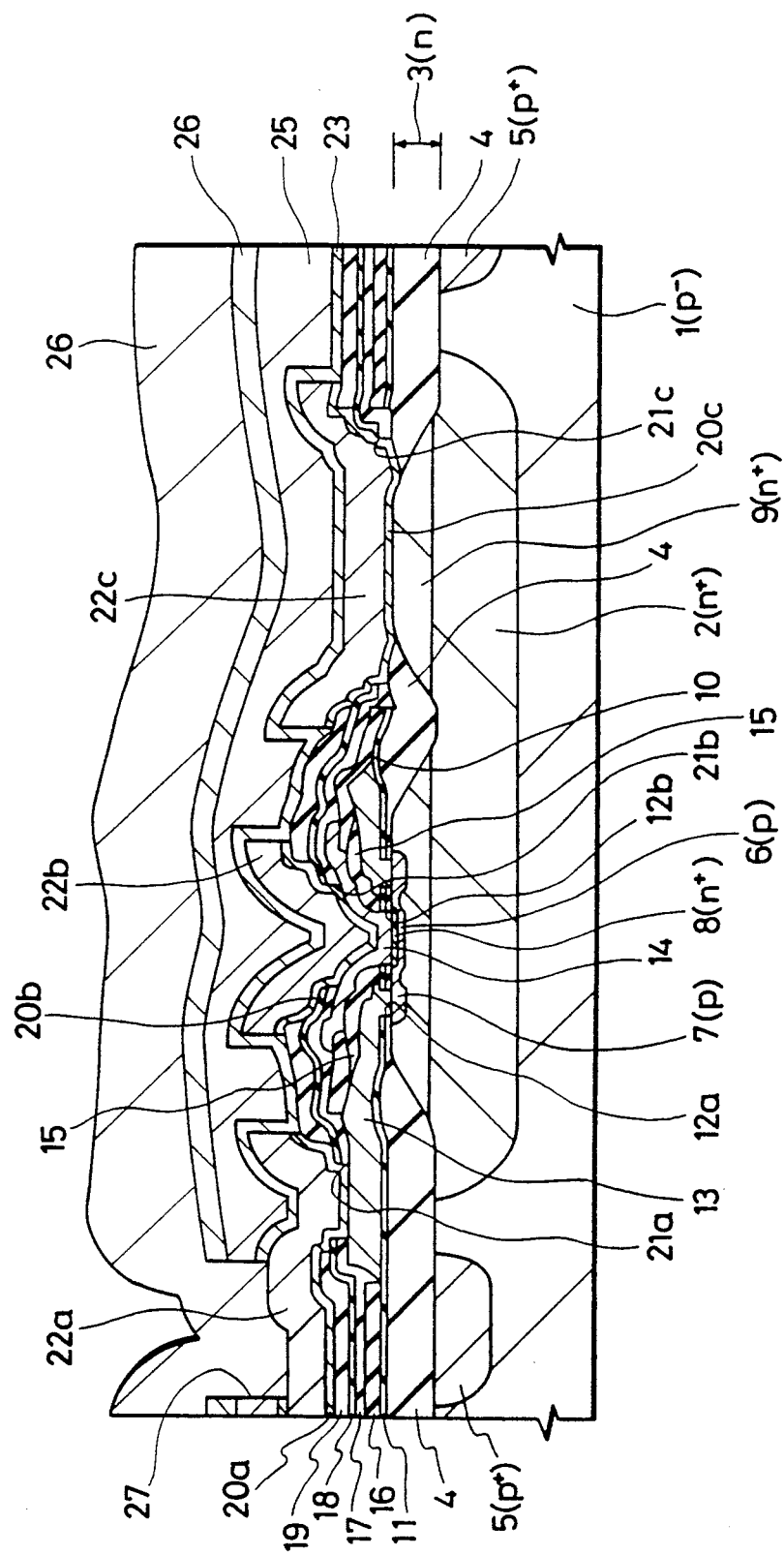

Subsequently, as illustrated in FIG. 5, a diffusion preventive film 23 is formed on the whole surface of the resultant substrate by, for example, plasma CVD. An insulator film 24 is successively formed on the whole surface of the resultant substrate and is thereafter annealed, whereby this insulator film 24 is caused to reflow so as to flatten the surface of the resultant substrate. The surface flattening can also be effected by employing, for example, an SOG film as the insulator film 24. In this case, the SOG film is baked after coating the diffusion preventive film 23 therewith. At the next step, a diffusion preventive film 25 is formed on the whole surface of the resultant substrate, whereupon the predetermined parts of the diffusion preventive film 25, the insulator film 24 and the diffusion preventive film 23 are etched and removed to form a through-hole 27. Subsequently, second-layer copper wiring 26 is formed by a method which is similar to the method employed for forming the first-layer copper wiring leads 22a, 22b and 22c. By the way, a diffusion preventive film (not shown) being electrically conductive, for example, TiN film is formed on the whole surface after the formation of the through-hole 27, and copper wiring 26 is formed on this diffusion preventive film, whereby the copper wiring 26 can be covered with the diffusion preventive film entirely even inside the through-hole 27.

Subsequently, as illustrated in FIG. 1, a diffusion preventive film 28, a surface flattening SOG film 29 and a diffusion preventive film 30 are formed in succession, whereupon the predetermined parts of these films 30, 29 and 28 are etched and removed to form through-holes 32. Subsequently, third-layer copper wiring leads 31a and 31b are formed, whereupon a diffusion preventive film 33 is formed on the whole surface of the resultant substrate. Subsequently, the predetermined part of the diffusion preventive film 33 is etched and removed to form an opening 33a, through which a piece of copper wire 34 is bonded to the copper wiring lead 31b by, for example, ball bonding. Then, the bipolar LSI intended is finished up. By the way, in actuality, the manufacturing process up to the formation of the openings 33a is carried out in the state of a wafer, and the copper wire pieces 34 are bonded after the wafer is split into semiconductor chips.

Although, in the above the present invention has been concretely described in conjunction with the embodiment, it is needless to say that the present invention is not restricted to the foregoing embodiment, but that it can be variously altered within a scope not departing from the purport thereof.

By way of example, the embodiment described before has referred to the case of the application of the present invention to the LSI having the three layers of copper wiring, but the present invention can be applied irrespective of the number of the layers of copper wiring. In addition, the present invention can be applied to various semiconductor integrated circuit devices having copper wiring, other than the bipolar LSI.

An effect which is attained by a typical aspect of performance of the present invention is briefly explained as follows:

Increase in the resistance of copper wiring can be prevented.

What is claimed is:

1. A semiconductor integrated circuit device comprising:

a first layer, comprising polycrystalline silicon and having impurity contained therein, on a semiconductor substrate;

a second layer on said first layer; and a third layer consisting essentially of copper on said second layer, whereby said second layer is between the first and third layers, wherein said second layer is made of a material that prevents said impurity from diffusing from said first layer to said third layer so as to prevent said impurity from diffusing into said third layer, whereby increase in resistivity of the third layer consisting essentially of copper, due to diffusion of the impurity into the third layer, is prevented.

2. A semiconductor integrated circuit device according to claim 1, wherein the thickness of the second layer is at least 100Å.

3. A semiconductor integrated circuit device according to claim 1, wherein said impurity is selected from the group consisting of phosphorus and arsenic.

4. A semiconductor integrated circuit device according to claim 3, wherein said second layer is a titanium nitride film.

5. A semiconductor integrated circuit device according to claim 1, wherein said insulating layer is selected from the group consisting of a phosphosilicate glass film, a borosilicate glass film and a borophosphosilicate glass film.

6. A semiconductor integrated circuit device according to claim 5, wherein said impurity is selected from the group consisting of phosphorus and boron.

7. A semiconductor integrated circuit device according to claim 6, wherein said second layer is selected from the group consisting of a silicon oxide film, a silicon nitride film and an alumina film.

8. A semiconductor integrated circuit device according to claim 1, further comprising a fourth layer, on said third layer; and a fifth layer, having impurity contained therein, on the fourth layer such that the fourth layer is between the fifth layer and third layer, the fourth layer being made of a material that prevents diffusion of the impurity in the fifth layer from the fifth layer into the third layer.

9. A semiconductor integrated circuit device according to claim 8, wherein the second and fourth layers sandwich the third layer.

10. A semiconductor integrated circuit device according to claim 1, wherein said second layer does not contain said impurity.

11. A semiconductor integrated circuit device according to claim 1, wherein said impurity is at least one selected from the group consisting of As, P and B.

12. A semiconductor integrated circuit device comprising:

a first wiring layer consisting essentially of copper over a semiconductor substrate;

an insulating layer with impurities formed on said first wiring layer, the insulating layer having through holes;

a second wiring layer consisting essentially of copper on said insulating layer and connected to said first wiring at said through holes;

a third layer between said first wiring and said insulating layer; and a fourth layer between said insulating layer and said second wiring layer, wherein said third and fourth layers are each made of material that prevents said impurities from diffusing from said insulating layer to said first and second wiring layers.

13. A semiconductor integrated circuit device according to claim 12, wherein the thickness of said third and fourth layers is at least 100Å.

14. A semiconductor integrated circuit device according to claim 12, wherein said third and fourth layers are titanium nitride layers.

15. A semiconductor integrated circuit device according to claim 12, wherein said insulating layer is selected from the group of a phosphosilicate glass film, a borosilicate glass film and borophosphosilicate glass film.

16. A semiconductor integrated circuit device according to claim 15, wherein said impurities are selected from the group consisting of phosphorus and boron.

17. A semiconductor integrated circuit device according to claim 12, wherein said third and fourth layers are selected from the group consisting of a silicon oxide film, a silicon nitride film and an alumina film.

* * * * *